(12) United States Patent
Fu

(10) Patent No.: US 6,255,696 B1
(45) Date of Patent: Jul. 3, 2001

(54) RETROGRADE ESD PROTECTION APPARATUS

(75) Inventor: Kuan-Yu Fu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/280,645

(22) Filed: Mar. 29, 1999

(51) Int. Cl.[7] .................. H01L 29/78; H01L 23/62
(52) U.S. Cl. .............. 257/355; 257/360; 257/356; 257/361; 257/173
(58) Field of Search ................. 257/355, 360, 257/356, 361, 173; 438/200, 133, 228, 282, 363

(56) References Cited

U.S. PATENT DOCUMENTS 5,386,134 * 1/1995 Huang .................................. 257/355
5,728,612 * 3/1998 Wei et al. ............................. 438/200

* cited by examiner

Primary Examiner—Matthew Smith
Assistant Examiner—Igwe U. Anya

(57) ABSTRACT

A retrograde ESD (electrostatic discharge) protection apparatus is disclosed. In a MOSFET (metal-oxide-semiconductor field effect transistor) having a source region, a drain region, a gate region, and a LDD (Lightly-Doped Drain) region, the ESD protection regions are implanted using heavy doped method under LDD region such that the implantation profile is optimized. The optimized profile is that the concentration of ESD protection region is heaviest at the source/drain junction region.

12 Claims, 3 Drawing Sheets

RETROGRADE ESD PROTECTION APPARATUS

BACKGROUND OF THE INVENTION

1. Field of the Invention

The present invention relates to metal-oxide-semiconductor (MOS) devices, and more particularly to electrostatic discharge (ESD) protection structures for metal-oxide-semiconductor devices.

2. Description of the Prior Art

The primary function of an ESD protection transistor is to direct ESD current away from the circuit it is protecting. Such ESD protection transistors are commonly used on microprocessors, embedded microcontrollers, application specific integrated circuits (ASIC) and other logic devices, primarily for protection of the input/output buffers. For example, in FIG. 1 is shown a semiconductor device 10 having a NMOS output buffer, e.g., connected to an output pad 14 via line 16, where a thick field dielectric transistor 18, which may be a thick field oxide (TFO) transistor, is connected to line 16 to protect the output buffer 12 from ESD pulses coming from output pad 14. A thick field oxide (TFO) transistor 18 acts as a parasitic bipolar transistor, but it must turn on before a NMOS transistor of the output buffer 12 reaches its impact ionization breakdown voltage. If the thick field oxide (TFO) transistor 18 is not designed to turn on first, then the output buffer will fail an ESD pulse or stress, at, for example, 1 kV. Typically, the level of ESD protection will vary as the fabrication process changes due to variations in the on-resistance characteristics of the output buffers. It will be appreciated that throughout the specification the ESD protection transistor being discussed may be employed between input pads and input buffers as well as at outputs, and for any other device requiring ESD protection.

A number of approaches have been used to improve ESD protection transistors. For example, silicide-blocked source and drain regions have been used to enhance ESD strength but the ESD protection is still insufficient. Another common method to ensure that ESD protection transistor turns on first is to increase the channel length of the output buffer transistors so that they are harder to turn on. However, this option results in an unacceptable increase in device area due to the simultaneous increase in device width that is necessary to maintain performance.

In input/output ESD protection metal-oxide-semiconductor (MOS) transistors, the current technology uses the ESD implant to dope the source/drain after the contact open and the doped profile is shown in FIG. 2. The main purpose of this ESD implant is to increase the impurity concentration and to deepen the junction in the Lightly Doped Drain (LDD) region. However, this does not guarantee the reduction of the current at the surface, if without optimizing the doping profile and its ESD protection cannot be maximized.

SUMMARY OF THE INVENTION

In accordance with the present invention, an ESD protection apparatus is provided that substantially optimizes the profile of ESD implantation. The optimized profile will reduce surface current and direct ESD current to a deeper substrate, because the breakdown voltage correlates to surface current sensitivity. Moreover, the optimized profile can maximize breakdown voltage of the ESD protection transistor.

An advantage of this invention is that the breakdown voltage of the ESD transistor can be independently optimized. Additionally, the structures of the present invention can be scaled to smaller features as new technologies permit integrated circuits to be reduced further in size.

In one embodiment, a gate electrode and Lightly Doped Drain (LDD) regions are formed in and on a substrate of a semiconductor device. The ESD implantation regions using phosphorous as source ions are then formed under the Lightly Doped Drain (LDD) regions. Then spacers are formed beside gate and source/drain regions are formed next. The optimized profile is that the concentration of ESD implantation is maximum at source/drain junction depth.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
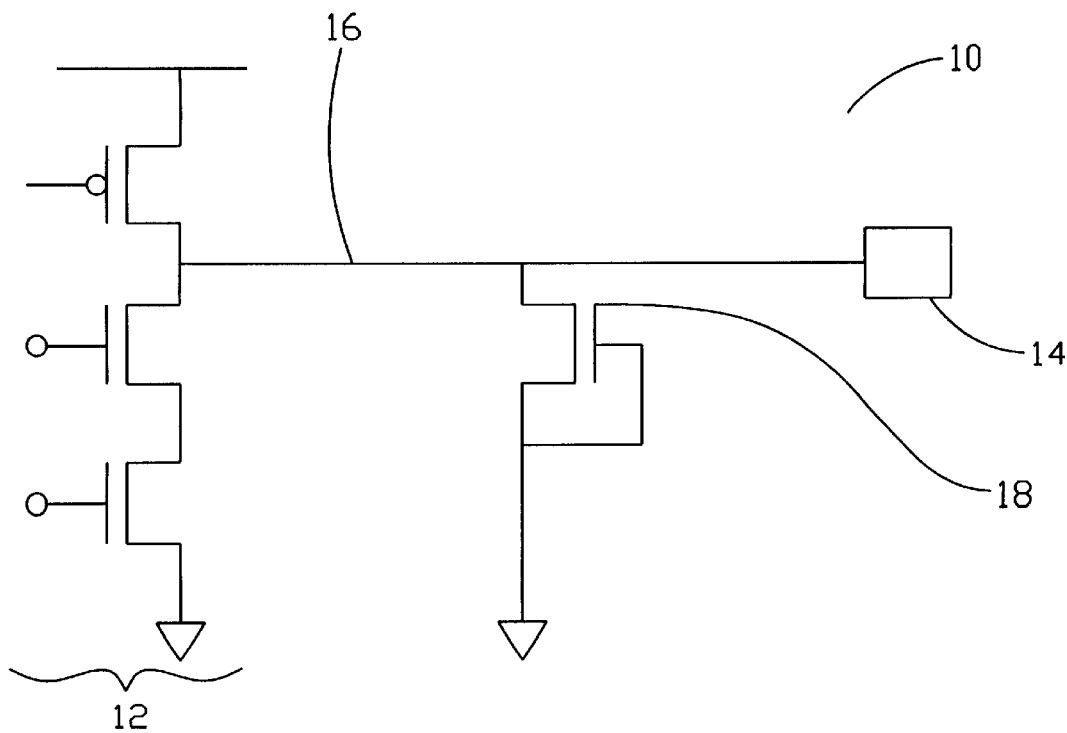
FIG. 1 is a conventional schematic circuit diagram of a semiconductor device having an ESD protection transistor between an output buffer and an output pad.
Figure 2:
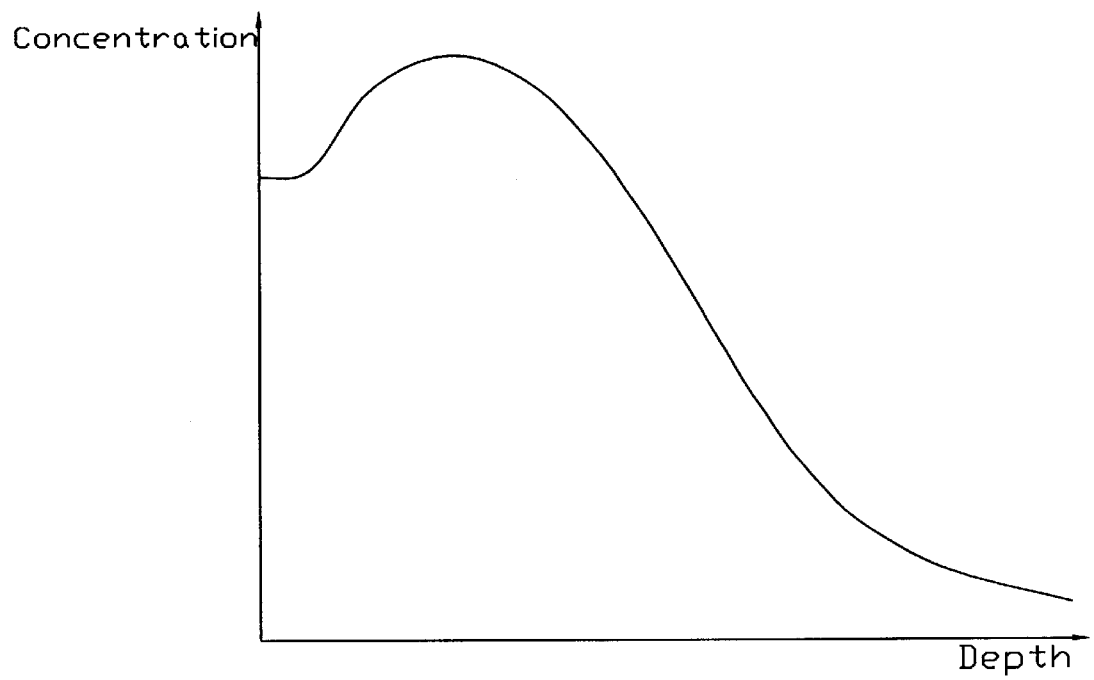
FIG. 2 shows a schematic diagram of a conventional ESD implantation profile.
Figure 3:
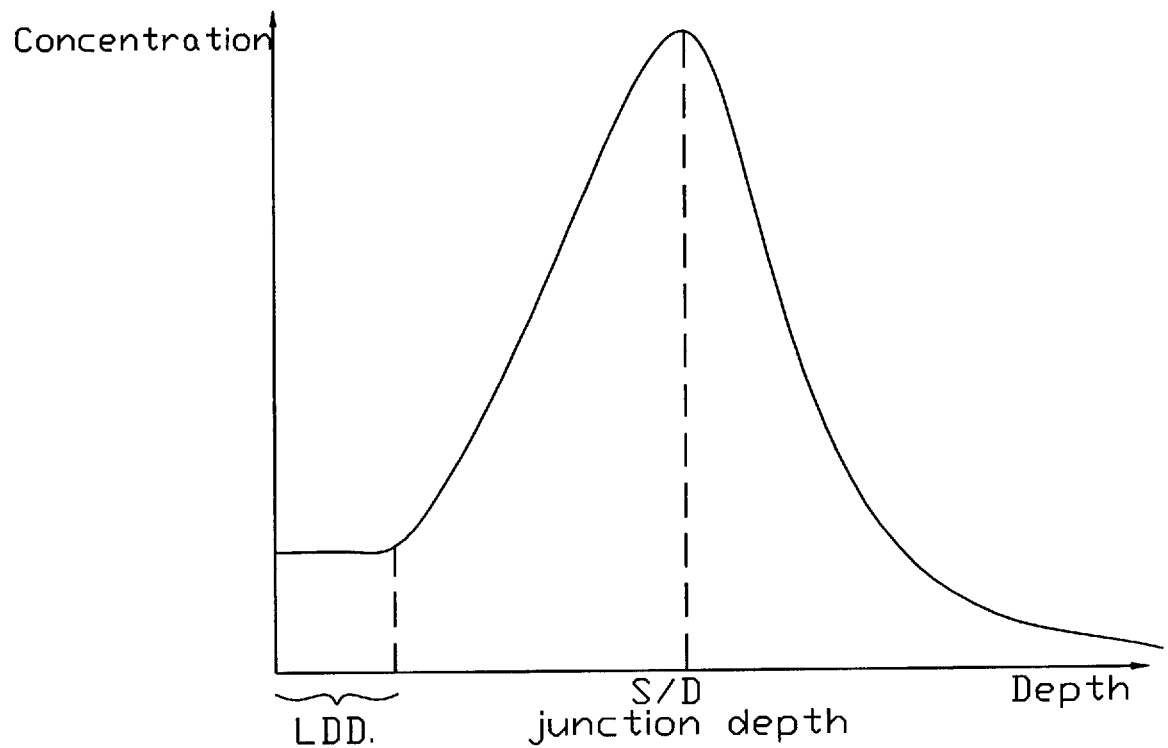
FIG. 3 shows a schematic diagram of an, ESD implantation profile by this invention.

We recommend retrograde doping profile for the source/drain junction of the ESD protection transistors, especially in the Lightly Doped Drain (LDD) region, using the ESD implant. The profile should be designed in such a way that the junction is as deep as possible (allowable by the process) and the impurity concentration is heaviest at the bottom of the junction and lightest at the surface, as shown in FIG. 3. Theoretically, this type of doping profile should minimize the surface current density and maximize the current density at the junction depth near the LDD region. This will result in an earlier bipolar turn-on, a bipolar turn-on current flowing deeper into the substrate, a delay in generating the second breakdown and thus a maximized ESD protection voltage.

In this embodiment, a n-type metal-oxide-semiconductor field effect transistor (MOSFET) is to be an ESD protection transistor, as shown in FIG. 4. Referring to FIG. 4A, gate 110 is formed using any conventional method, such as depositing and patterning a metal or doped polysilicon, on p-substrate 100 in a semiconductor device. A boron implant or other suitable techniques for selectively doping the regions 112 beside gate 110 is illustrated herein. That the concentration of this implant is light, about $10^{17}/cm^3$, is in order to prevent the short channel effect from happening and to be the Lightly Doped Drain (LDD) regions.

Figure 4A:
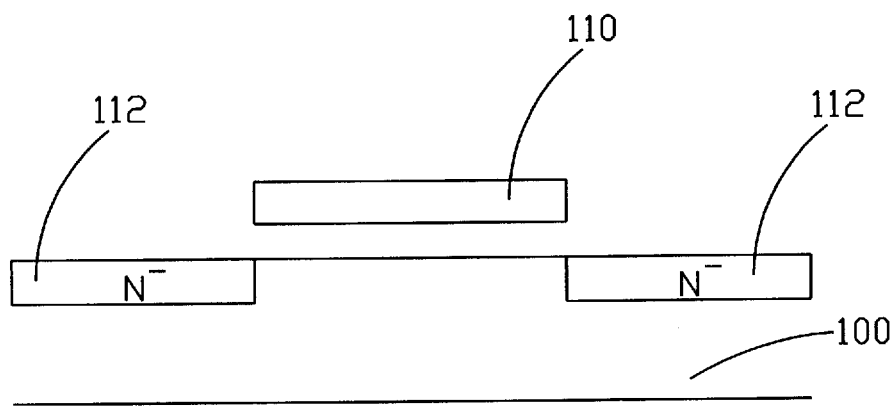
FIGS. 4A to 4D show cross-sectional views illustrative of various stage in the fabrication of an ESD protection transistor in accordance with one embodiment of the present invention.
Figure 4B:
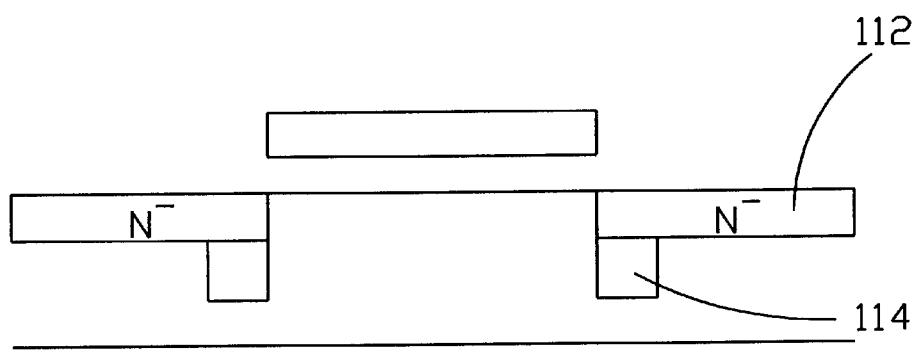

A pad oxide layer is deposited and patterned such that ESD implant regions 114 can be doped under regions 112 and then the pad oxide is removed, as shown in FIG. 4B. The source ions of ESD implant may be phosphorous ions in this embodiment, but other source ions may also be used. In a non-limiting embodiment of this invention, the ESD implant dose may range from about $10^{13}$ to $10^{14}$ ions/cm$^2$. Moreover, the dose or concentration of this ESD implant is determined by the avalanche breakdown voltage desired for the ESD transistor. The energy of this ESD implant should be chosen such that the projected range lies at about the edge of the subsequently formed source/drain regions, for example, 0.2 to 0.3 um. Nevertheless, the concentration of ESD implant is heaviest at source/drain junction.

Figure 4C:
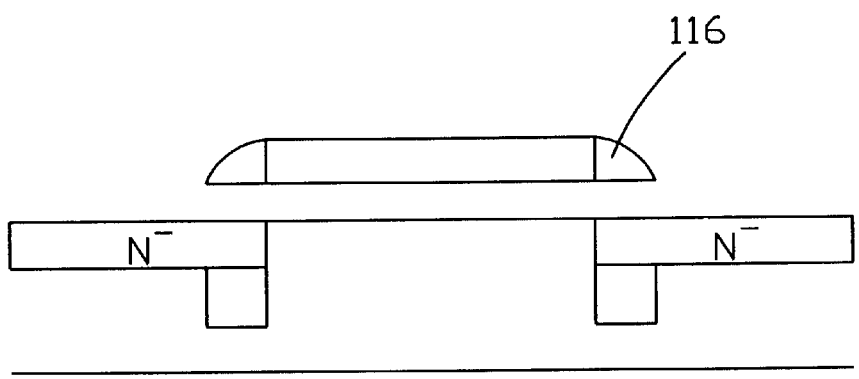

After forming ESD implant regions 114, an oxide layer is formed using any suitable methods, such as chemical vapor deposition, and then is removed by anisotropic dry etching to form spacers 116, as shown in FIG. 4C. Because oxide layer deposited near side wall of gate 110 in metal-oxide-semiconductor device is thicker than others, spacers 116 can be formed by the characteristic of anisotropic dry etch. The aim of this step is to isolate gate 110 from source/drain regions 112 and to form source/drain regions 118 by heavy doping, as shown in FIG. 4D.

Figure 4D:
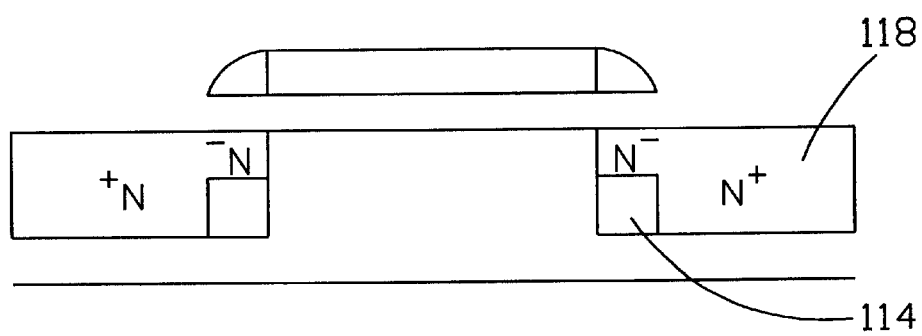

Referring to FIG. 4D, gate 110 and spacers 116 are used as masks to dope source/drain regions 118 heavily. Each of the source/drain regions 118 has an impurity concentration of at least $10^{19}$ atoms/cm$^3$. Because the concentration in ESD implant regions 114 is heavier than Lightly Doped Drain regions, the electric field in ESD implant regions 114 is higher than others in source/drain regions 118. When an ESD event occurs, the ESD current will go through regions 114 more easily. Other planarization layers and protective layers (not shown) would be conventionally added. One or more of these steps forms an electrical connection between the gate 110 and the source region 118, but is not shown in the figures. The optimized profile in FIG. 3 can be obtained by this embodiment of this invention.

Although specific embodiments have been illustrated and described, it will be obvious to those skilled in the art that various modifications may be made without departing from what is intended to be limited solely by the appended claims.

What is claimed is:

1. An ESD protection apparatus comprising:
    a metal-oxide-semiconductor field effect transistor having a gate, source/drain, and Lightly Doped Drain formed in and on a substrate; and
    and an ESD protection region only under and adjacent to said Lightly Doped Drain such that directs ESD current.

2. The apparatus according to claim 1, wherein the implant depth of said ESD protection region is about the same with a source/drain junction.

3. The apparatus according to claim 1, wherein the implant concentration of said ESD protection region is maximum at a source/drain junction and about the same with the dose of said source/drain.

4. An ESD protection circuit comprising a p-type transistor in series to a n-type transistor and connected to an output pad, wherein said n-type transistor provides an ESD protection region under a Lightly Doped Drain such that the region has a maximum concentration at a source/drain junction.

5. The circuit according to claim 4, wherein the depth of said ESD protection region with said maximum concentration is about from 0.2 to 0.3 um.

6. The circuit according to claim 4, wherein the maximum concentration of said ESD protection region is about $10^{19}$ ions/cm$^2$.

7. An ESD protection transistor comprising:
    a gate, source/drain, and Lightly Doped Drain; and
    an ESD implant region only under and adjacent to said Lightly Doped Drain and implant depth of the ESD implant region being about the same depth of the source/drain such that directs ESD current.

8. The transistor according to claim 7, wherein the depth of said ESD implant region with said maximum concentration is about from 0.2 to 0.3 um.

9. The transistor according to claim 7, wherein the maximum concentration of said ESD implant region is about $10^{19}$ ions/cm$^2$.

10. An ESD protection structure comprising:
    a substrate of a first conductivity;
    a gate region on the substrate of a second conductivity opposite said first conductivity, wherein the gate region includes a polysilicon gate region placed over a dielectric layer;
    a source/drain region within the substrate, the source/drain region including:
        a first implant region of said second conductivity at a first concentration, the first implant region extending under the gate region, and
        a second implant region of said second conductivity adjacent to said first implant region at a second concentration greater than said first implant region and larger in area and depth than said first implant region; and
    an ESD implant region of said second conductivity only under and adjacent to said first implant region at a third concentration, wherein the ESD implant region is adjacent to said second implant region.

11. The ESD protection structure according to claim 10, wherein the third concentration is maximum at depth of said second implant region.

12. The ESD protection structure according to claim 11, wherein the maximum third concentration is about the same as said second concentration.

* * * * *